United States Patent [19]

Gailus

[11] Patent Number: 4,626,802

[45] Date of Patent: Dec. 2, 1986

[54] GAAS FET OSCILLATOR NOISE REDUCTION CIRCUIT

[75] Inventor: Paul H. Gailus, Prospect Heights, Ill.

[73] Assignee: Motorola, Inc., Schaumburg, Ill.

[21] Appl. No.: 685,710

[22] Filed: Dec. 24, 1984

[51] Int. Cl.[4] ............................................. H03B 5/00
[52] U.S. Cl. ..................... 331/117 FE; 331/116 FE; 331/109; 331/183
[58] Field of Search ............... 331/108 B, 108 R, 109, 331/116 R, 116 FE, 117 R, 117 FE, 183

[56] References Cited

U.S. PATENT DOCUMENTS

| 3,878,481 | 4/1975 | Healey, III | 331/116 R |
| 3,993,963 | 11/1976 | Logan et al. | 357/16 X |
| 4,047,126 | 9/1977 | Anderson | 331/96 |
| 4,135,168 | 1/1979 | Wade | 331/108 R |
| 4,208,639 | 6/1980 | Stickel | 331/116 FE |
| 4,454,485 | 6/1984 | Fisher | 331/109 |

OTHER PUBLICATIONS

Siweris, et al., "Analysis of Noise Up-Conversion in Microwave FET Oscillators", IEEE-MTT vol. 33, #3, Mar. 1985, pp. 233-241.

Riddle, et al., "A New Method of Reducing Phase Noise in GaAs FET Oscillators", IEEE-MTT-S Int. Microwave Symp. Dig., 1984, pp. 274-276.

Primary Examiner—Eugene R. LaRoche
Assistant Examiner—Robert J. Pascal
Attorney, Agent, or Firm—James E. Jacobson, Jr.; Edward M. Roney; Donald B. Southard

[57] ABSTRACT

A method and means for reducing noise in a GaAs FET oscillator circuit is described. The circuit of the present invention achieves low noise oscillator operation by driving the gate input of the GaAs FET oscillator circuit with a source of voltage which exhibits a low impedance at baseband frequencies and driving the drain input with a source of current which exhibits a high impedance at said frequencies. The present invention further operates to control the D.C. voltage present on the drain terminal of the GaAs FET device regardless of the drain current, while simultaneously maintaining a constant D.C. drain current at some predetermined value which corresponds to optimum low-noise operation.

7 Claims, 5 Drawing Figures

GAAS FET OSCILLATOR NOISE REDUCTION CIRCUIT

FIELD OF THE INVENTION

This invention relates to the field of microwave oscillator circuits and specifically to a method and means of controlling a GaAs FET oscillator circuit in a manner which achieves improved low-noise operation.

BACKGROUND OF THE INVENTION

The large gain, power output capability, and high efficiency of GaAs FETs makes them very attractive for oscillator applications. Also, because of recent market competition, microwave GaAs FET oscillators may be lower in cost than competitive designs. However, one characteristic that has been a problem in many GaAs FET applications is the relatively large flicker noise of GaAs FETs when compared to silicon bipolar transistors and GaAs Gunn diodes. In the certain applications for which the present invention was developed, the signal-to-noise ratio of a GaAs FET oscillator is often unacceptable at lower frequencies without the present noise reduction circuit.

GaAs FET flicker noise arises from random electron capture and release in surface states and lattice defects of the GaAs crystal. Flicker noise varies as 1/f in power per unit bandwidth. With most devices, this noise would be insignificant at UHF and microwave frequencies. However, non-linearities present in any practical device lead to noise modulation when a relatively large oscillator signal is present. This noise manifests itself as amplitude modulation (AM) and frequency modulation (FM) noise exhibited as sidebands located around a carrier frequency.

The AM sidebands can be reduced by the compression characteristics of subsequent amplifiers, but the FM sidebands remain. Therefore, it is essential that the FM sidebands must be minimized to start with. The present invention lowers the sideband noise by reducing the non-linear modulation effect. Other techniques that have been used to perform this task include low frequency feedback around the device and the use of automatic gain control (AGC) instead of internal device limiting. At microwave frequencies, an AGC circuit would be difficult and expensive to implement. The circuit of the present invention, improves oscillator noise substantially, in many cases, in excess of 10 dB. Other potential applications of GaAs FET oscillators that may benefit from the present invention include devices which operate in the sub-microwave range, for example 800 Mhz.

SUMMARY AND OBJECTS OF THE INVENTION

Briefly described, the present invention contemplates a GaAs FET oscillator bias circuit which reduces oscillator noise by maintaining a low impedance termination at the gate terminal of the GaAs FET oscillator device and a high impedance at the drain terminal of the GaAs FET device. The present invention also achieves low-noise operation by maintaining a constant D.C. voltage on the drain terminal of the GaAs FET oscillator device while maintaining a constant D.C. current into the drain terminal which is preset at a value which corresponds to optimum low-noise oscillator operation.

Accordingly, it is an object of the present invention to provide a GaAs FET oscillator bias circuit which allows low noise oscillator operation.

It is another object of the present invention to provide a GaAs FET oscillator bias circuit which provides improved low noise operation while being constructed of common "off the shell" devices.

It is yet another object of the present invention to provide a GaAs FET oscillator bias circuit which maintains low noise oscillator operation over a wide range of temperatures.

It is still another object of the present invention to greatly reduce the noise upconversion process, and to do so over substantial temperature excursions and with device-to-device variations associated with production GaAs FETs.

DETAILED DESCRIPTION OF THE DRAWINGS

Figure 1:
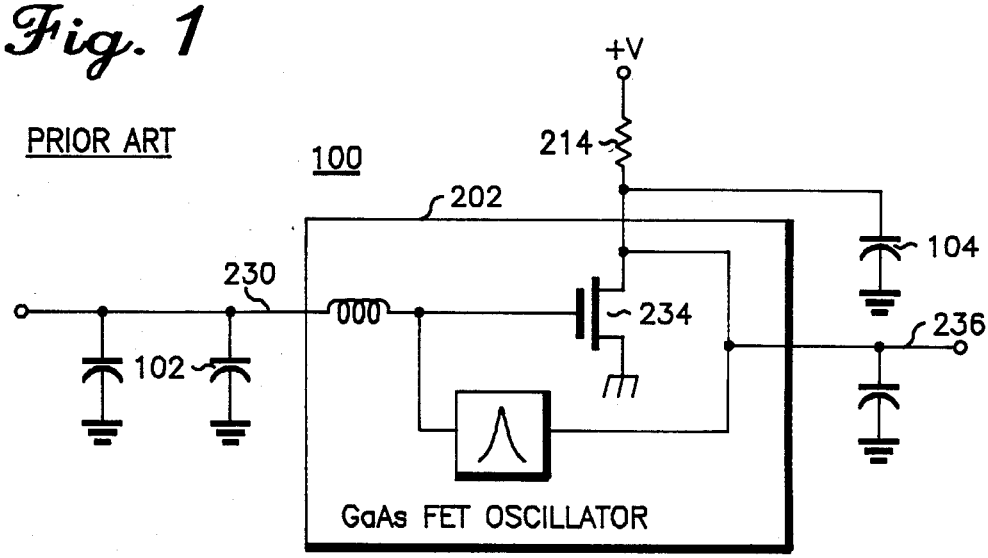
FIG. 1 is a schematic and block diagram of a typical prior art GaAs FET oscillator bias circuit.

FIG. 1 shows a prior art GaAs FET oscillator biasing circuit. In the typical prior art GaAs FET oscillator circuit, a bypass capacitor 104 presents a low impedance at baseband frequencies to the drain power input 232 of GaAs FET 234. In a like manner, bypass capacitor 102 presents a low impedance at baseband frequencies to the gate bias input 230. The oscillator signal amplitude at output 236 is determined by limiting in the drain voltage of GaAs FET 234. Because of the noise which is always present in any practical device, the voltage level at which the oscillator signal limiting occurs is not constant but fluctuates randomly as a function of time. However, the average drain voltage remains substantially constant over a baseband frequency cycle due to the low impedance of capacitor 104.

Figure 3A:
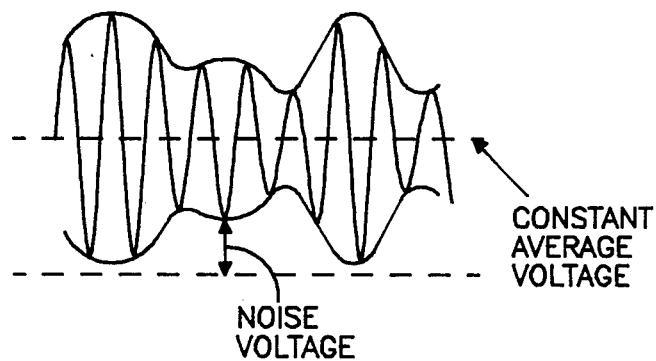
FIGS. 3a and 3b are waveform diagrams detailing the operation of the GaAs FET oscillator bias circuit of the present invention.

The result, shown in FIG. 3a, is that the drain waveform is amplitude modulated by the noise. The modulation process frequency converts the baseband frequency noise to the vicinity of the oscillator carrier frequency. This is undesirable for the vast majority of oscillator applications. Because of the non-linear capacitance at the gate of the GaAs FET, the amplitude noise modulation also causes frequency noise modulation to occur. This is usually even less desirable than amplitude modulation.

Figure 3B:
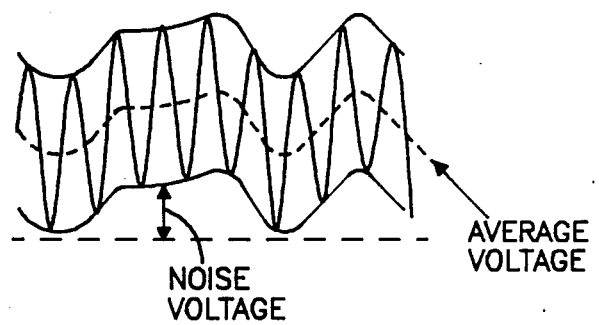

According to the teachings of the present invention, improved low noise oscillator operation may be achieved by presenting a relatively high impedance at baseband frequencies to the drain power input 232, instead of the low impedance characteristic which is common in the prior art. The high impedance allows the drain voltage to track noise fluctuations at baseband frequencies as shown in FIG. 3b. Since the noise is linearly superimposed on the oscillator signal, the modulation effect is substantially eliminated. The present invention maintains the drain DC voltage at a relatively fixed value which is independent of the D.C. drain current so that the desired oscillator signal output is also substantially fixed.

While the AM noise is substantially reduced by the mechanism described above, there is always some residual AM noise that is converted into FM noise by the GaAs FET. This conversion is a function of drain current. It has been found that each GaAs FET has a particular drain current which minimizes this conversion process. The present invention allows this current to stet set to an optimum value by means of an adjustable potentiometer, and it maintains this current independent of parameter changes in the GaAs FET which are induced by temperature variations. Additionally, the present invention provides a linear impedance at the drain power input 232 and the gate bias input 230 of FIGS. 2 and 4. This feature is important for oscillators which must be modulated with a high degree of linearity.

Figure 2:
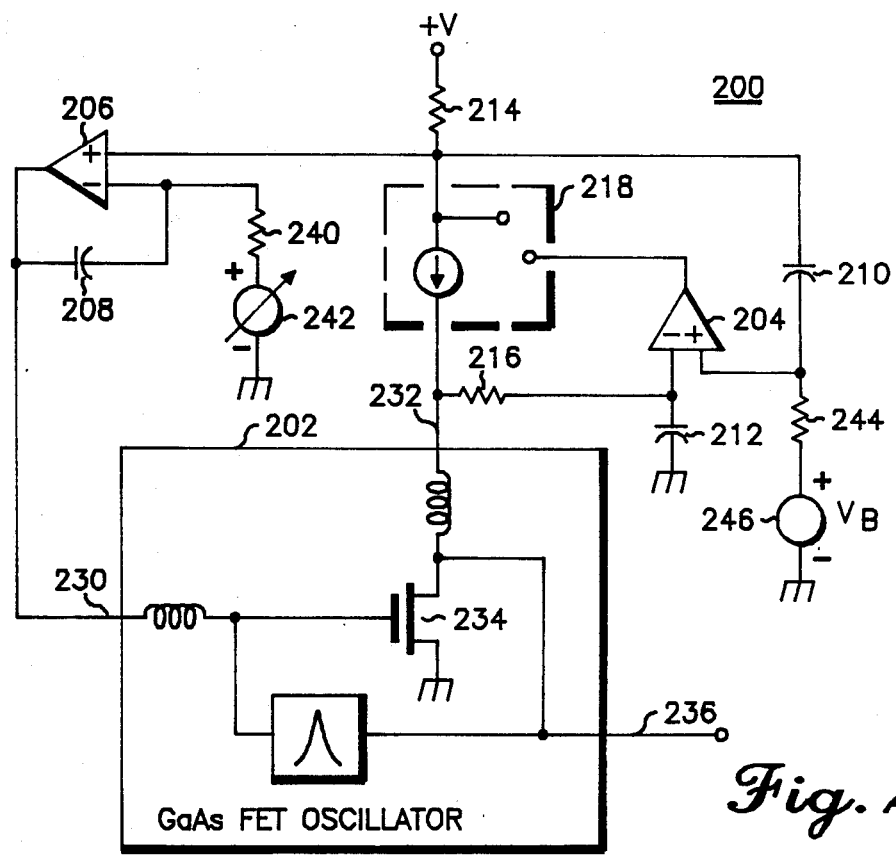
FIG. 2 is a schematic and block diagram of the GaAs FET oscillator bias circuit of the present invention.
Figure 4:
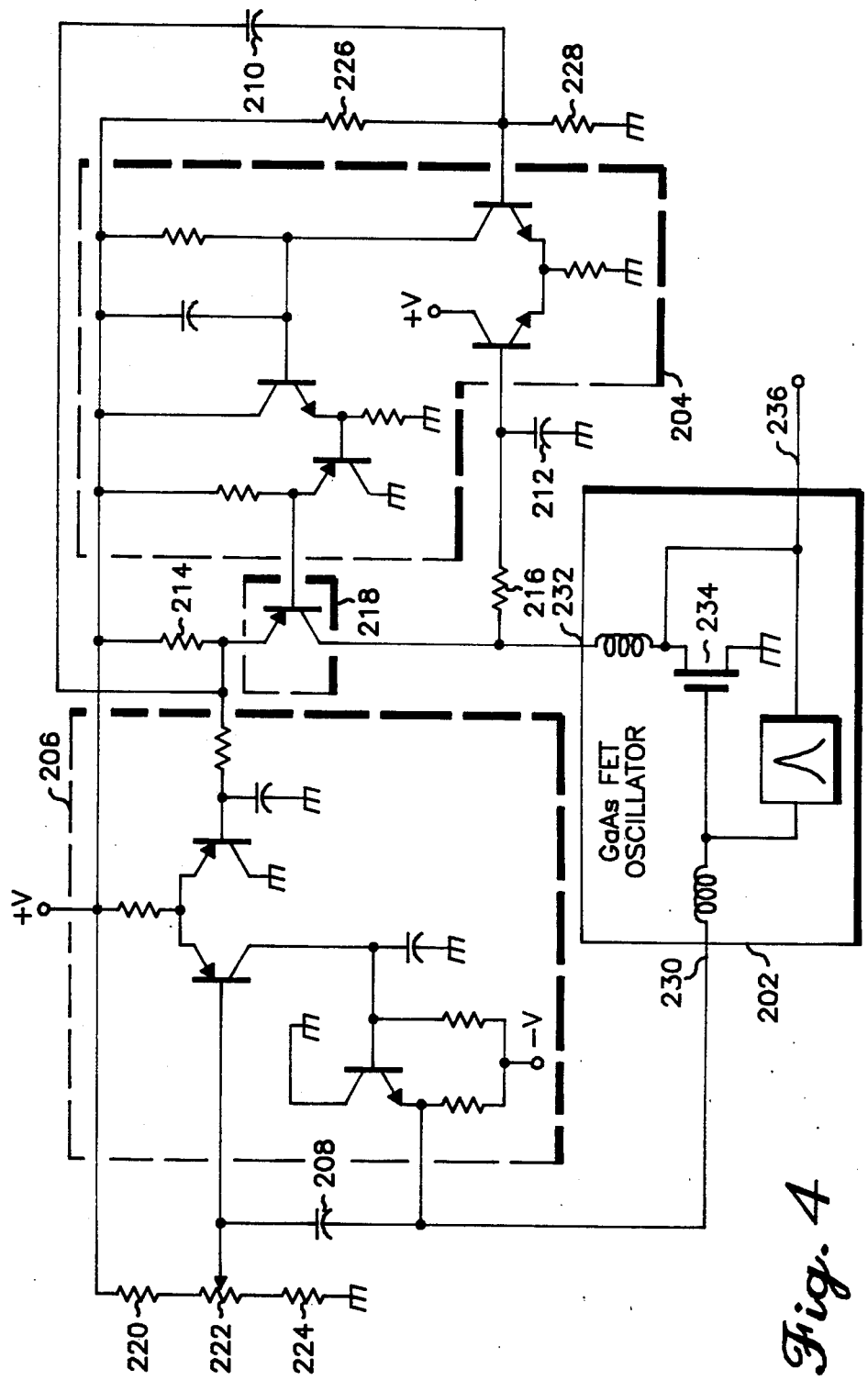
FIG. 4 is a detailed circuit diagram of the preferred embodiment of the present invention.

The present invention is represented in functional block form in FIG. 2 and at the component level in FIG. 4. It should be noted that any of several GaAs FET oscillator configurations would function satisfactorily in accordance with the teachings of the present invention. Further, several well known differential amplifier techniques may be employed in constructing error amplifiers which may be used advantageously with the noise reduction of the present invention. Finally, many well known controllable current source techniques may also be employed without departing from the principles of the present invention.

According to FIG. 2, the controlled current source 218 supplies a current to the GaAs FET drain power input 232 in response to the output of differential amplifier 204. Negative feedback through resistor 216 causes the differential amplifier 204 to drive variable current source 218 such that the resulting current maintains the drain input 232 at substantially the same DC voltage as voltage source 246. Voltage source 246 and series resistor 244 of FIG. 2 are the Thevenin equivalents of the resistive divider formed by 226 and 228 of FIG. 4.

Differential amplifier 206 drives gate bias input 203 such that the resulting D.C. current flowing through drain input 232, and hence through resistor 214, is appropriate to induce a DC voltage at resistor 214 which is equal to that at variable voltage source 242. Hence, the drain D.C. current at 232 is maintained at a value which is proportional to the setting at variable voltage source 242. Due to the large gain of differential amplifier 206, this current is held substantially constant with temperature induced changes in the transconductance of GaAs FET 234. Therefore, the optimized current setting for lowest noise can thereby be maintained over temperature variations. In FIG. 2, the voltage source 242 and series resistor 240 are the Thevenin equivalents of the resistive divider formed by resistors 220, 224 and potentiometer 222 of FIG. 4.

At baseband frequencies, typically in the range of 10 KHz to 10 MHZ, capacitors 212 and 210 are essentially short circuits. The AC potential at the inverting input of differential amplifier 204 is therefore zero volts. Feedback through differential amplifier 204 and controlled current source 218 maintains the potential at the noninverting input of 204 at the same zero volt potential. Hence, the AC potential across resistor 214, and therefore, the AC current through resistor 214, is zero. Because resistors 216 and 244 are relatively large, the AC current through the GaAs FET drain input 232 is substantially the same as that through resistor 214, i.e., close to zero. The fact that the AC current is so small implies that the invention is presenting a high impedance to the drain input 232 at baseband frequencies. This is the desired result for low noise operation as was described earlier. Because feedback is maintained around the differential pairs of amplifiers 204 and 206 at baseband frequencies, the impedance presented to the drain input 232 and the gate bias input 230 is very linear.

In summary, a noise reducing bias circuit for use with a GaAs FET oscillator is described. The present invention contemplates a GaAs FET oscillator bias circuit which reduces oscillator noise by maintaining a low impedance termination at the gate terminal of the GaAs FET oscillator device and a high impedance at the drain terminal of the GaAs FET device. The present invention also achieves low-noise operation by maintaining a constant D.C. voltage on the drain terminal of the GaAs FET oscillator device while maintaining a constant D.C. current into the drain terminal which is preset at a value which corresponds to optimum low-noise oscillator operation. Accordingly, other uses and modifications will be obvious to one of ordinary skill in the art without departing from the spirit and scope of the present invention.

I claim:

1. An improved low-noise FET oscillator comprising:
   (a) oscillator means having a FET device with gate and drain terminals, wherein an output signal may be derived from the drain terminal of said FET device;
   (b) means for driving the gate terminal of the FET oscillator circuit with a source of voltage which exhibits a low impedance at baseband frequencies.
   (c) means for driving the drain input of the FET oscillator circuit with a source of current which exhibits a high impedance at baseband frequencies.
   (d) means for maintaining the average D.C. voltage present on the drain terminal of the FET device at a relatively constant value, regardless of the average D.C. drain current, and
   (e) means for maintaining constant D.C. drain current at a predetermined value which corresponds to low noise oscillator operation.

2. An improved low-noise GaAs FET oscillator comprising:
   (a) oscillator means having a GaAs FET device with gate and drain terminals, wherein an output signal may be derived from the drain terminal of said GaAs FET device;
   (b) means for driving the gate terminal of the GaAs FET oscillator circuit with a source of voltage which exhibits a low impedance at baseband frequencies.
   (c) means for driving the drain input of the GaAs FET oscillator circuit with a source of current which exhibits a high impedance at baseband frequencies.
   (d) means for maintaining the average D.C. voltage present on the drain terminal of the GaAs FET device at a relatively constant value, regardless of the average D.C. drain current, and
   (e) means for maintaining constant D.C. drain current at a predetermined value which corresponds to low noise oscillator operation.

3. The oscillator circuit of claim 1 wherein said GaAs FET oscillator means includes a GaAs FET transistor with feedback means for inducing transistor oscillation.

4. The oscillator circuit if claim 1 wherein said means for driving the gate input of the GaAs FET oscillator includes a high gain differential amplifier with high-pass negative feedback, and an adjustable voltage source.

5. The oscillator circuit of claim 1 wherein said drain terminal voltage and current maintaining means includes a voltage controlled current source which is controlled by an error amplifier whose output is dependent on the output of the voltage controlled current source.

6. A GaAs FET oscillator bias circuit for providing low noise oscillator operation, said circuit comprising:
 (a) current sensing means for producing a voltage related to current flow;
 (b) variable current source means coupled to said current sensing means having a control input for variably controlling the output current of said variable current source wherein said variable current source means is provided with a high impedance output;
 (c) GaAs FET oscillator means having a gate bias terminal, and a drain terminal power input coupled to the output of said current source, wherein an oscillator output signal may be derived from said drain terminal;
 (d) first error amplifier means having a first input coupled to a voltage reference means and a second input coupled to the output of said variable current source means, and an output coupled to the control input of said variable current source;
 (e) A.C. feedback means coupled between the first input of said first error amplifier means, and the output of said current sensing means;
 (f) second error amplifier means with a predetermined low-pass frequency response having a first input coupled to said current sensing means and a second input coupled to an adjustable voltage reference means, and an output which is D.C. coupled to the gate input of said GaAs FET oscillator.

7. A method of reducing noise in a GaAs FET oscillator, said method comprising the steps of:
 (a) driving the gate input of the GaAs FET oscillator with a source of voltage which exhibits a low impedance at baseband frequencies.
 (b) driving the drain input of said oscillator with a source of current which exhibits a high impedance at baseband frequencies.
 (c) maintaining a relatively constant average D.C. voltage present on the drain terminal of the GaAs FET, regardless of the D.C. drain current, and
 (d) maintaining relatively constant D.C. drain current at a predetermined value which corresponds to low-noise oscillator operation.

* * * * *